United States Patent
Steinbrueck et al.

(10) Patent No.: US 11,099,122 B1
(45) Date of Patent: Aug. 24, 2021

(54) PROXIMITY DETECTOR

(71) Applicant: BECS Technology, Inc., St. Louis, MO (US)

(72) Inventors: Todd Steinbrueck, St. Louis, MO (US); Timothy Lee Bell, St. Louis, MO (US)

(73) Assignee: BECS TECHNOLOGY, INC., St. Louis, MO (US)

( * ) Notice: Subject to any disclaimer, the term of this patent is extended or adjusted under 35 U.S.C. 154(b) by 81 days.

(21) Appl. No.: 16/800,849

(22) Filed: Feb. 25, 2020

(51) Int. Cl.
    *G01N 15/10* (2006.01)
    *G01N 21/25* (2006.01)
    *G01N 21/31* (2006.01)
    *G01R 23/165* (2006.01)

(52) U.S. Cl.
    CPC ......... *G01N 21/255* (2013.01); *G01N 21/314* (2013.01); *G01R 23/165* (2013.01)

(58) Field of Classification Search
    CPC .............. G01N 15/0205; G01N 15/10; G01N 15/1434; G01N 15/1459; G01N 2201/061; G01N 2201/0621
    See application file for complete search history.

(56) References Cited

U.S. PATENT DOCUMENTS

| | | | |
|---|---|---|---|
| 9,408,369 B2 | 8/2016 | Dubinsky | |
| 10,336,552 B1 | 7/2019 | Steinbrueck et al. | |
| 2009/0139436 A1 | 6/2009 | Memory | |
| 2010/0200089 A1 | 8/2010 | Fleshner | |
| 2012/0104032 A1 | 5/2012 | Bahn | |
| 2012/0250484 A1* | 10/2012 | Polley | G11B 21/21 369/53.39 |
| 2013/0036976 A1 | 2/2013 | Pickens | |
| 2017/0142930 A1 | 5/2017 | Huang | |
| 2018/0044113 A1 | 2/2018 | Westover | |

* cited by examiner

*Primary Examiner* — David P Porta
*Assistant Examiner* — Fani Boosalis
(74) *Attorney, Agent, or Firm* — Bryan Cave Leighton Paisner LLP

(57) ABSTRACT

A proximity detector includes a sensor providing a proximity reading. The proximity detector is capable of comparing the reading to a rising threshold level and a falling threshold level, wherein the falling threshold level is less than the rising threshold level. The proximity detector filters the proximity reading through three low pass filters using a three different time constants to generate three filtered readings. While the proximity detector is in the no material present state, the proximity detector will enter the material present state when the second filtered reading is less than the difference between the first filtered reading and the falling threshold. While the proximity detector is in the material present state, the proximity detector enters the no material present state when the third filtered reading is greater than the sum of the first filtered reading and the rising threshold.

10 Claims, 10 Drawing Sheets

PROXIMITY DETECTOR

FIELD OF THE INVENTION

This invention relates generally to methods and systems for detecting the presence of materials near a sensor and, more particularly, to improvements in the techniques for processing signals received by proximity detectors capable of sensing the presence of granular materials.

BACKGROUND OF THE INVENTION

Proximity detectors may be used to detect the presence or level of granular materials. In general, these proximity detectors must be, and remain, properly calibrated. There are a number of issues in the field that can make the calibration of a proximity detector problematic.

Proximity detectors come in a number of forms, e.g., optical, capacitive, etc. Each of these sensing mechanisms has its advantages and disadvantages. For example, capacitive sensors can be impacted by various environmental factors, such as humidity, which can alter the baseline capacitance reading in the absence of material in the proximity of the detector. As a second example, the strength of the signal from an optical sensor can be impacted by the color of the granular material. Light colored material (white/yellow) will allow more reflected light through while dark colored material (brown) gives a greater signal contrast between presence and absence of material. As a third example, various component pieces of the sensor (or associated electronics) can drift over time (e.g., diminished light output from an optical light source or diminished sensitivity for an optical detector). Thus, there is a need for a system implementing techniques to mitigate these issues.

SUMMARY OF THE INVENTION

According to one aspect of the present invention, a proximity detector has two states, a no material present and a material present state. The proximity detector filters the proximity reading through three low pass filters using a three different time constants to generate three filtered readings. Preferably, the first time constant is greater than the third time constant and the second time constant is less than the first time constant and greater than the third time constant. While the proximity detector is in the no material present state, the proximity detector will enter the material present state when the second filtered reading is less than the difference between the first filtered reading and a falling threshold. While the proximity detector is in the material present state, the proximity detector enters the no material present state when the third filtered reading is greater than the sum of the first filtered reading and a rising threshold.

In yet another embodiment, the proximity detector filters the proximity reading through a low pass filter using a fast time constant to generate a fast filtered reading and filters the proximity reading through a low pass filter using a slow time constant to generate a slow filtered reading. While the proximity detector is in the no material present state, the proximity detector will enter the material present state when the proximity reading is less than the difference between the fast filtered reading and a falling threshold. While the proximity detector is in the material present state, the proximity detector will enter the no material present state when the proximity reading is greater than the sum of the slow filtered reading and a rising threshold.

The algorithms described herein will be resilient to threshold placement and capable of recalibration by exploiting the varying nature of the signal during the transition region.

BRIEF DESCRIPTION OF THE FIGURES

These and other features, aspects and advantages of the invention will become more fully apparent from the following detailed description, appended claims, and accompanying drawings, wherein the drawings illustrate features in accordance with an exemplary embodiment of the present invention, and wherein:

DETAILED DESCRIPTION OF THE INVENTION

Figure 1:
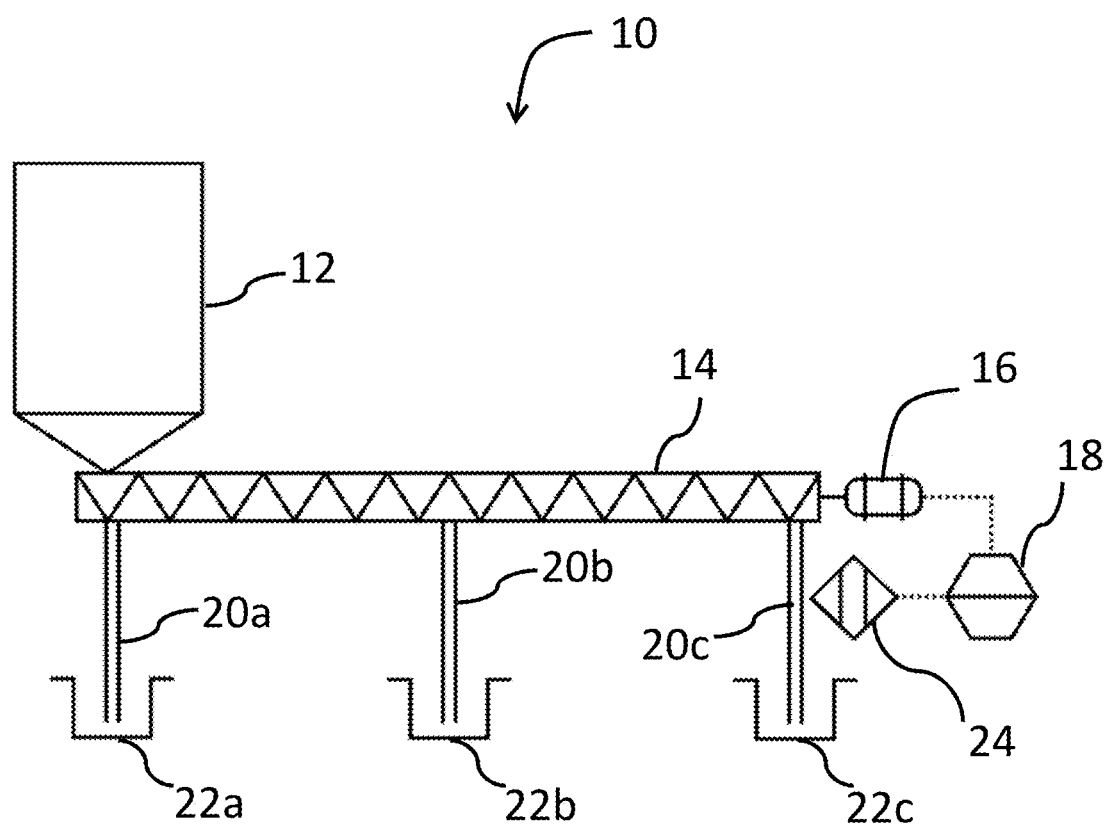
FIG. 1 is a block diagram illustrating the principal components of an embodiment of a granular material distribution system.

Various embodiments may be described in connection with a feed distribution system, although the systems and methods described herein may be used with other forms of systems tracking the movement or collection of granular material. Referring to FIG. 1, the feed distribution system 10 includes a feed bin 12 housing animal feed (or any form of granular material) for dispersion to a screw-based conveyor 14 (e.g., an auger) for delivery to a set of feeders 22 distributed along the conveyor 14. As feed is moved from the bin 12 to the feeders 22, the left-most feeder 22a fills first, followed by feeder 22b, and then the feeder 22c at the distal end of the conveyor. Of course, the system 10 may include any reasonable number of feeders. The feeders 22 may receive the granular feed from the conveyor 14 thru delivery tubes 20. A proximity detector 24 may be located operationally adjacent to the delivery tube 22c connected to the final feeder 22c. When the proximity detector 24 senses feed in the delivery tube 22c, thus signaling that all feeders 22 are full, it commands to conveyor motor 16 to stop via microprocessor 18. Preferably, the proximity detector 24 includes one or more optical sensors, each providing a light intensity reading. Other forms of proximity detectors are also within the scope, including those using capacitive sensors.

Figure 2:
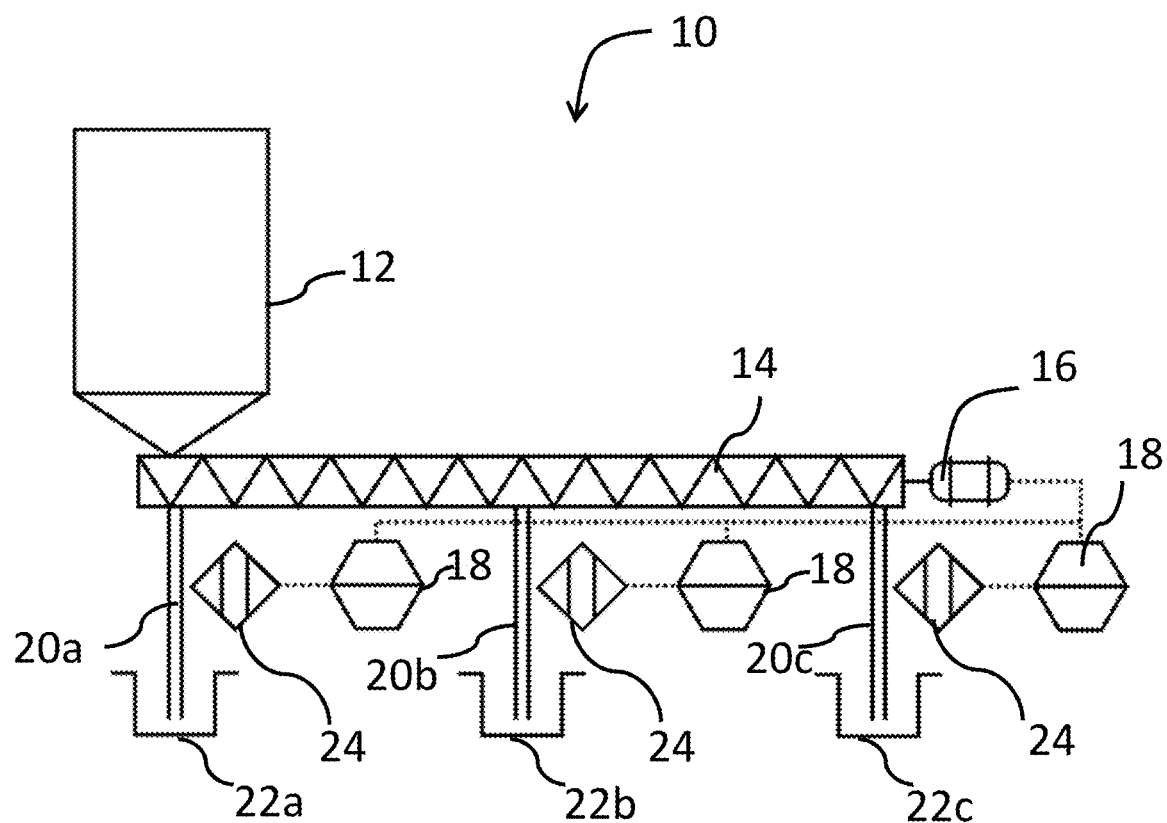
FIG. 2 is a block diagram illustrating the principal components of an another embodiment of a granular material distribution system.

Another system 10 is illustrated in FIG. 2, in which each delivery tube 20a, 20b, and 20c, leading to the feeders 22a, 22b, and 22c, is instrumented with a proximity detector 24 coupled to the motor 16 through microprocessors 18. Only when all of the proximity detectors 24 are indicating the presence of feed is the motor 16 driving the conveyor 14 turned off.

Figure 3:
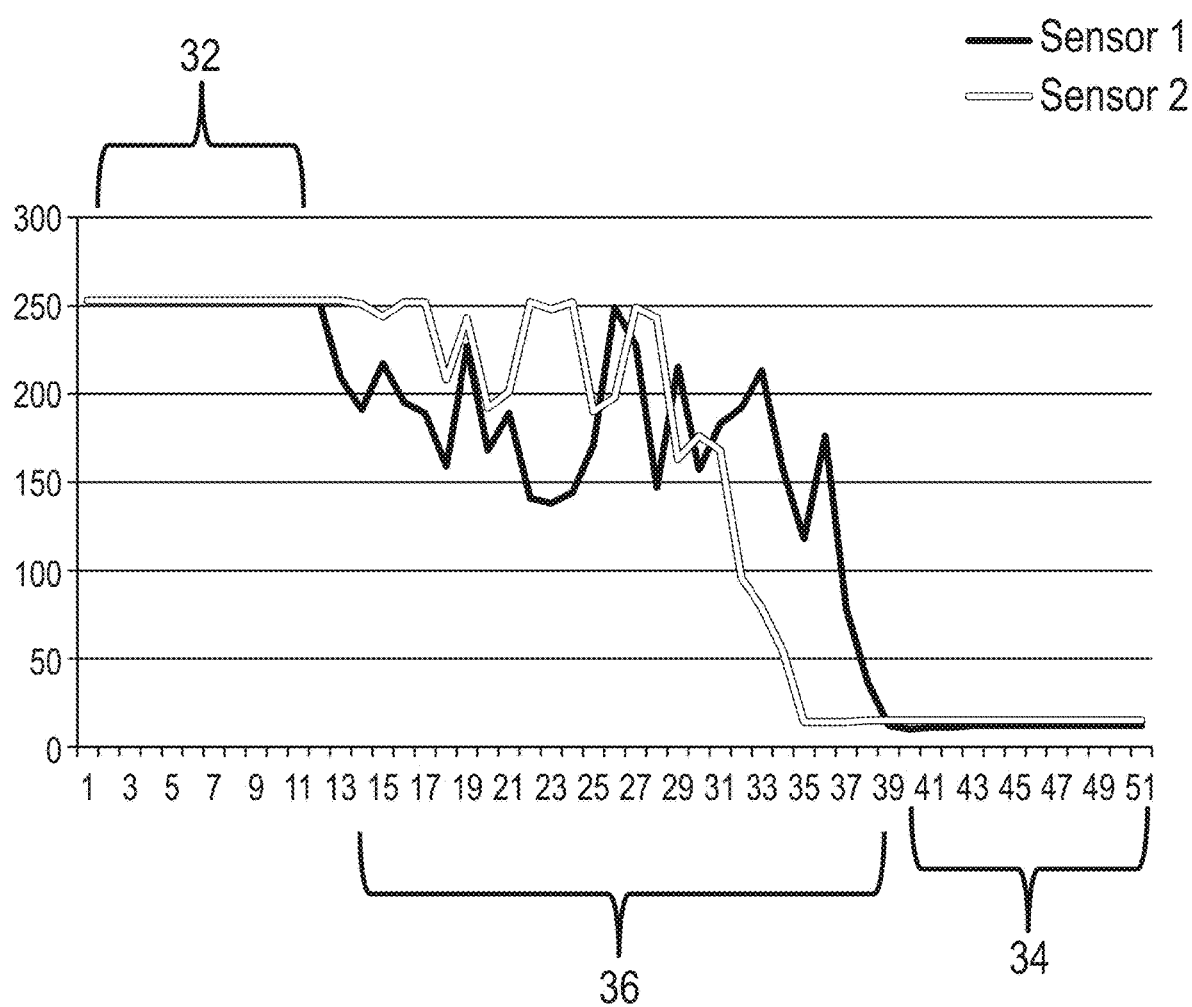
FIG. 3 is a representation of signal traces from two optical sensors.

FIG. 3 illustrates a pair of raw sensor readings from an optical proximity detector, such as one that may be used with the configurations depicted in FIGS. 1 and 2. In this embodiment, the proximity detector 24 has two light sources and two photodetectors, and is capable of sensing transmitted light intensity across two paths crossing the delivery tube 20. Without feed, at the beginning of the trace, the signal is high on both sensors, indicating no feed is present. As feed is delivered and is falling through the delivery tube 20, the transmitted light varies over a period of time. Once the feed fills the delivery tube, the signal level stabilizes at a low level.

As depicted in FIG. 3, between the initial no feed condition 32 and the final feed present condition 34, there is a varying signal region 36 during which the signal may be highly varying. The existence of this varying signal region 36 may be exploited to improve the operation of the proximity detection function.

Conventional proximity detectors establish a threshold signal level, and when the raw sensor reading passes this threshold, the sensor indicates "feed present." However, in connection with FIG. 3, if a threshold of 150 were used with the raw signals, sensor 2 would operate properly. However, sensor 1 would indicate "feed (or material) present" at time 22, return to "no feed" at time 25, again briefly indicate "feed present" at time 28, and toggle between "no feed" and "feed present" some more before finally stabilizing at "feed present" at time 37. Although one may simply lower the detection threshold to 100, feed having a different color may exhibit the same behavior at this new threshold. The algorithms described herein will be resilient to threshold placement by exploiting the varying nature of the signal during the transition region.

In one embodiment, an algorithm for processing the signals from the proximity detector 24 for reporting the presence of feed in the delivery tube 20 includes three states: (i) no feed; (ii) transition; and (iii) feed present. The result or output of the algorithm will be positive (i.e., feed present) only for the final feed present state, while it will be negative (i.e., no feed) for both the no feed and transition states. Thus, the algorithm does not permit the output of the proximity detector to show feed present while the signal is toggling during the varying signal region.

The proximity detector 24 receives a current light intensity reading from the photodetector and repetitively compares the current light intensity reading to a preset rising threshold level and a preset falling threshold level. In certain embodiments, the detector also tracks the minimum and/or the maximum values of the light intensity reading, i.e., the value of the light intensity reading at its lowest and highest value.

In this embodiment, the proximity detector 24 continuously stores a minimum reading value for the light intensity reading. The proximity detector 24 preferably reports the presence of feed (or any other form of granular material) in the delivery tube only if the light intensity reading remains less than the falling threshold level and within a small epsilon value of the minimum reading value for a predetermined period of time. For example, in connection with grain, the small epsilon value may be approximately 1-2% of the total range for the intensity signal and the predetermined period of time may be about one-half to two seconds.

Figure 4:
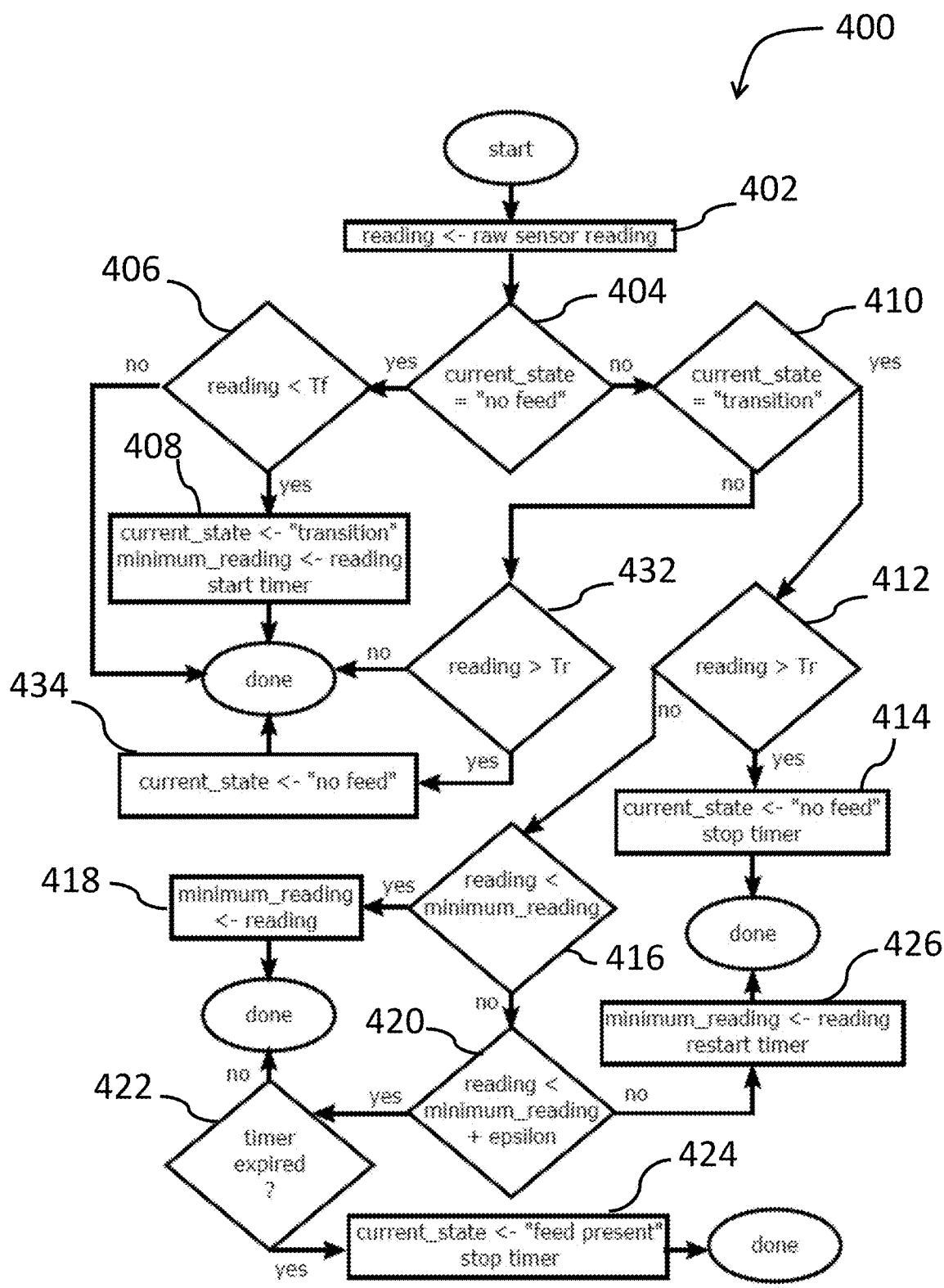
FIG. 4 is a flow chart describing an algorithm used to process signals from a proximity detector used with a granular material distribution system.

FIG. 4 illustrates a method 400 for determining the presence of feed in the delivery tube 20 in greater detail. The algorithm provides two thresholds: a falling threshold (Tf) and a rising threshold (Tr). Upon startup, the initial state is set to "no feed." The method 400 takes different control paths based on whether the current state is no feed, transition, or feed present.

At step 402, the variable current reading is set based on the light intensity from the raw sensor reading. At step 404, if the current state is no feed, and if, at step 406, the reading is less than the falling threshold (Tf), then: (i) the current state is set to transition; (ii) the variable minimum reading is set to the current reading; and (iii) a timer is initialized to, for example, about 500 to 2,000 msec (step 408). This timer counts down with each successive reading of the light intensity and, thus, each pass through the algorithm depicted in FIG. 4. For example, referring to FIG. 3, if the falling threshold is set to 150, the transition state would start at time 22 for sensor 1.

If, however, the current state is "transition" (step 410), and if the current reading is greater than the rising threshold (Tr) (step 412), then, at step 414, the current state is set back to "no feed" and the timer is stopped. This situation would occur when the signal fell below the falling threshold level, but then quickly rose back above the rising threshold level before the timer expired. Continuing the example from the previous paragraph with respect to FIG. 3, if the rising threshold is set to 200, at time 26 the algorithm would return to the "no feed" state. It will return to the transition state at time 35, and after time 40, whenever the timer expires, the algorithm will go to the "feed present" state. Otherwise, if the current reading is less than the minimum reading (step 416), then at step 418, the variable minimum reading is set to the current reading in order to track the minimum intensity reading. While still in the transition stage, at step 420, if the current reading is less than the minimum reading plus a small epsilon value, and if the timer has expired (step 422), then, at step 424, the current state is set to "feed present" and the timer is stopped. Otherwise, where the current reading is greater than or equal to the minimum reading plus a small epsilon amount, indicating that the signal remains highly variable and does not appear to be stabilizing at a low point, then at step 426, the minimum reading is set to the current reading and the timer re-started.

If the current state is feed present, and if the current reading is greater than the rising threshold (Tr) (step 432), the current state is set to "no feed" at step 434.

Figure 5:
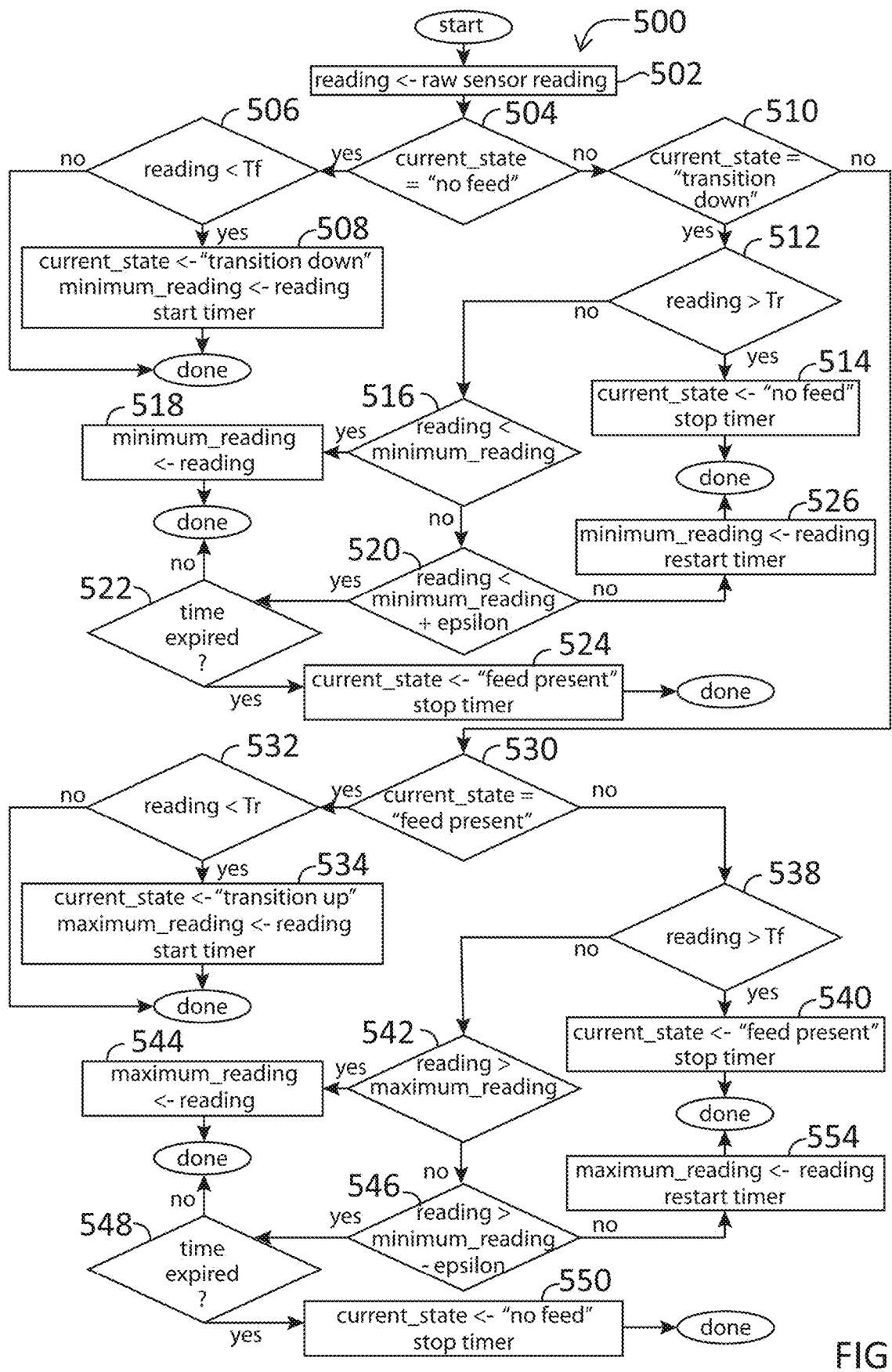
FIG. 5 is a flow chart describing an alternative algorithm used to process signals from a proximity detector used with a granular material distribution system.

As illustrated in FIG. 5, the above algorithm can be expanded to 4 states: "no feed", "transition down", "transition up", and "feed present" if the desire is to maintain the previous output during the transitions. In this case, the output would signal proximity detected for the "feed present" and "transition up" states and no proximity detected for the "no feed" and "transition down" states.

In this embodiment, the proximity detector 24 continuously stores a maximum reading value for the light intensity reading in addition to the minimum reading value. Here, when the proximity detector 24 is reporting material present and the light intensity reading rises above the rising threshold level and remains above the rising threshold level and within a small epsilon value of the maximum reading value for a predetermined period of time, the proximity detector will report no material present.

In this embodiment, the method takes different control paths based on the current state: no feed, transition up, feed present, and transition down. Again, the initial state is "no feed." The method 500 begins at step 502 in which the current reading is set based on the light intensity from the raw sensor reading. At step 504, if the current state is no feed and if the current reading is less than the falling threshold (Tf) (step 506), the control passes to step 508 in which the current state is set to "transition down," the variable minimum reading is set to the value of the current reading, and a timer is initiated. This timer counts down with each successive reading of the light intensity and, thus, each pass through the algorithm depicted in FIG. 5.

In step 510, if the current state is "transition down," and if the current reading is greater than the rising threshold (Tr) (step 512), then, in step 514, the current state is set to "no feed," and the timer is stopped, indicating that the intensity ready temporarily fell below the falling threshold, but quickly rose back up above the rising threshold (thus indicating the high variability of the signal). Otherwise, if the current reading is less than the minimum reading (step 516), then the variable minimum reading is set to the current reading (step 518). In step 520, if the current reading is less than the minimum reading plus a small epsilon value, and if the timer has expired (step 522), then, in step 524, the current state is set to "feed present," and the timer is stopped. Otherwise, where the current reading is greater than the minimum reading plus the small epsilon value, control passes to step 526 where the minimum reading is set to the current reading and the timer is restarted.

In step 530, if the current state is "feed present," and if the current reading is greater than the rising threshold (Tr) (step 532), the control passes to step 534 in which the current state is set to "transition up," the variable maximum reading is set to the current reading, and a timer is started.

Where the current state is "transition up," if the current reading is less than the falling threshold (Tf) (step 538), the control passes to step 540, in which the current state variable is set to "feed present," and the timer is stopped. Otherwise, in step 542, if the current reading is greater than the maximum reading, the maximum reading variable is set to the current reading in order to track the maximum intensity reading (step 544). In step 546, if the current reading is greater than the maximum reading less a small epsilon value and, in step 548, if the timer has expired, then in step 550, the current state is set to "no feed," and the timer is stopped. Otherwise, where the current reading is less than or equal to the maximum reading less a small epsilon value, then control passes to step 554 in which the variable maximum reading is set to the current reading and the timer is re-started.

Yet another embodiment is to retain a series of readings, for example, over a period of time (e.g., about 1 to 2 seconds), and operate not on just the latest of these readings, but operate on the collection of readings taken over the period. If, over the period, the variations in the readings (highest reading to lowest reading) are greater than a preset selected value, then the current state is set to transition. If, over the period, the variations in the readings are less than the preset selected value, the state is either no feed or feed present, which can be determined by comparing the latest reading to the thresholds.

When the system is not in transition (i.e., material is either present or not present), the readings over the period may be averaged to determine the "nominal" reading for the current state ("no feed" or "feed present"). Any time the reading crosses the threshold, a new threshold may be computed, for example, half-way between the "nominal" reading in the "no feed" state and the "nominal" reading in the "feed present" state.

In another embodiment, the proximity detector 24 may include two optical sensors—i.e., two pairs of light sources and photodetectors. The optical sensors may be arranged such that the light rays cross the delivery tube 20 at varying angles and or locations. The proximity detector 24 may use either of the algorithms described above in connection with FIG. 4 or 5 with certain modifications to account for the inclusion of two (or more) readings from the sensors. For example, steps 402 and 502 may be expanded to include two current reading variables—one based on the light intensity from a first raw sensor reading, and a second based on the light intensity from a second raw sensor reading. At each step where comparisons are made to the current reading, the two current readings are both compared and combined either with an AND function (i.e., the test must be true for all readings) or an OR function (i.e., the test must be true for any reading). Alternatively, the algorithms may be executed for each input reading individually and the results combined. For example, if any algorithm is in the "feed present" state, then the proximity detector will indicate feed detected.

For a system such as illustrated in FIG. 2, which uses a detector 24 at each delivery tube 20, the methods illustrated in FIG. 4 or 5 may be used with each detector 24 and the conveyor 14 shut off when any of the detectors 24 indicates feed present or, alternatively, when all of the detectors 24 indicate feed present.

An extension of the above approaches illustrated in FIGS. 4 and 5 uses the minimum reading detected during the "feed present" state and the maximum reading detected during the "no feed" state to automatically adjust the two threshold values. This embodiment enables the proximity detector 24 to compensate for varying conditions that might impact the raw values (e.g., humidity for a capacitive sensor, feed color for an optical sensor).

For example, the minimum and maximum readings may be maintained while in the "feed present" and "no feed" states, and then reset when exiting the respective "feed present" or "no feed" state, so that a new minimum and maximum is maintained each time the system enters the state. Using this approach, the thresholds can be maintained at a fixed ratio of the full scale swing experienced by the raw readings. For example, the rising threshold may be set to Tr=minimum+0.75*(maximum−minimum) and the falling threshold may be set to Tf=minimum+0.25*(maximum−minimum). In this way, the proximity detector 24 will adapt to changing conditions on each transition to/from feed being present.

Figure 7:
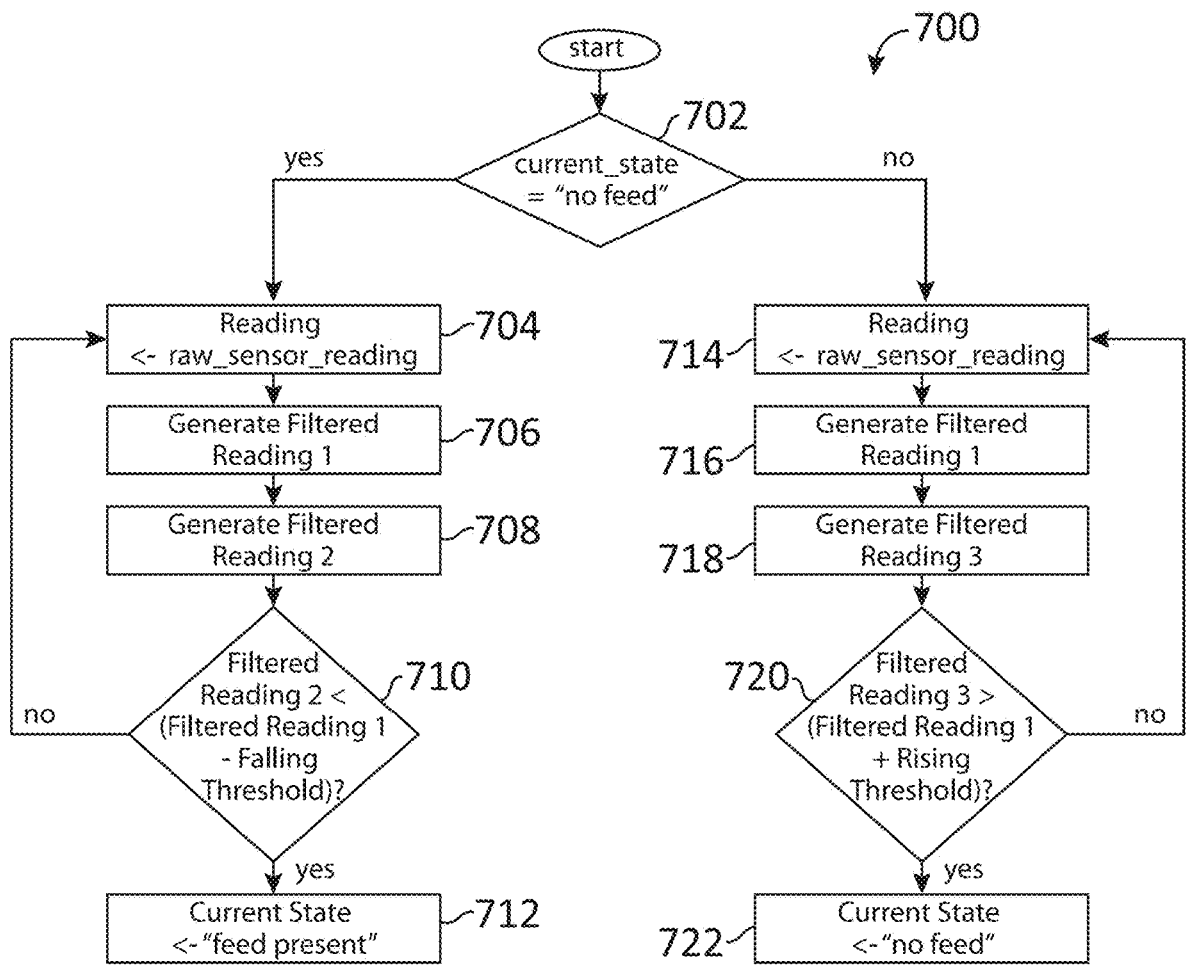
FIG. 7 is a flow chart describing an alternative algorithm used to process signals from a proximity detector that may be used with a granular material distribution system.

FIG. 7 illustrates another embodiment having only two states: "no feed" and "feed present." In many circumstances, the transition in state of a proximity detector has different timing properties when changing in either direction, which can be exploited to more effectively compensate for slow changes in environmental conditions. The transition from "feed present" to "no feed" can be slower than the transition from "no feed" to "feed present." In addition, it is necessary for the proximity detector to respond more quickly to the transition from "no feed" to "feed present" than the transition in the other direction. As is known in the art, the actual sensor reading can drift due to environmental conditions (e.g., humidity for a capacitive sensor or dust for an optical sensor).

This embodiment relies on three time constants. A first time constant is set long to reflect environmental changes. A second time constant is set short to reflect the need for responsiveness in transitioning from the "no feed" to the "feed present" state. A third time constant is set in between the first and second time constants to reflect the potentially slower responsiveness in transitioning from the "feed present" to the "no feed" state. As an example, the first time constant could be set within a range of 8 to 24 hours, preferably in the range of 8 to 16 hours; the second time constant could be set within a range of 1 to 60 seconds, preferably in the range of 10 to 30 seconds; and the third time constant could be set within a range of 30 minutes to 8 hours, preferably in the range of 1 to 2 hours.

The method 700 begins at step 702 and illustrated in connection with an optical sensor but those skilled in the art will recognize that other forms of sensors could be used. If the current state is no feed, then control passes to step 704 in which the current reading is set based on the light intensity from the raw sensor reading. Control passes to step 706 in which a first filtered reading is generated based on the result of running the current reading through a first low pass filter using the first time constant. Next, at step 708, a second filtered reading is generated based on the result of running the current reading through a second low pass filter using the second time constant. If the second filtered reading is less than the difference between the first filtered reading minus the falling threshold (Tf) (step 710), control passes to step 712 in which the current state is set to "feed present." Otherwise, the state remains set to "no feed" and control returns to step 704 to obtain the next reading.

If the current state is feed present (step 702), then control passes to step 714 in which the current reading is set based on the light intensity from the raw sensor reading. Control passes to step 716 in which a first filtered reading is generated based on the result of running the current reading through a first low pass filter using the first time constant. Next, at step 718, a third filtered reading is generated based on the result of running the current reading through a third low pass filter using the third time constant. If the third filtered reading is greater than the sum of the first filtered reading and the rising threshold (Tr) (step 720), control passes to step 722 in which the current state is set to "no feed." Otherwise, the state remains set to "feed present" and control returns to step 714 to obtain the next reading.

In each of the three low pass filters, a number of possible filter implementations may be used as is known in the art, including averaging a ring buffer of recent readings, FIR (finite impulse response) filters, and/or IIR (infinite impulse response) filters.

Figure 8:
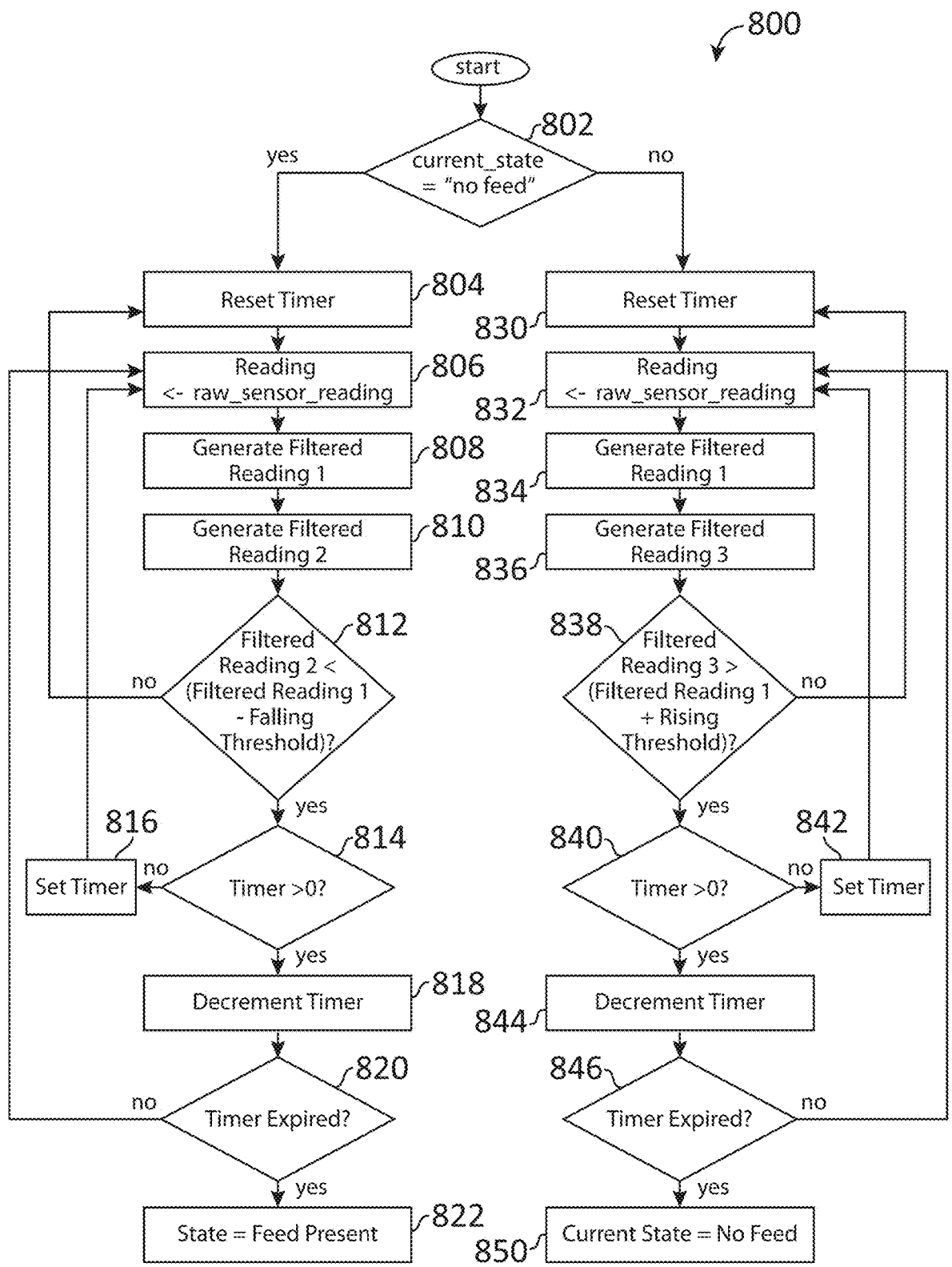
FIG. 8 is a flow chart describing an alternative algorithm used to process signals from a proximity detector that may be used with a granular material distribution system.

FIG. 8 expands on the embodiment described in FIG. 7 and depicts another embodiment in which the states do not change unless the readings remain across the thresholds for a set period of time. This method beginning at step 802. If the current state is no feed, then control passes to step 804 in which a timer is initialized to zero. In step 806, the current reading is set based on the light intensity from the raw sensor reading. Control passes to step 808 in which a first filtered reading is generated based on the result of running the current reading through a first low pass filter using the first time constant. Next, at step 810, a second filtered reading is generated based on the result of running the current reading through a second low pass filter using the second time constant. If the second filtered reading is not less than the difference between the first filtered reading minus the falling threshold (Tf) (step 812), then control returns to step 804 to reset the timer. However, if the second filtered reading is less than the difference between the first filtered reading minus the falling threshold (Tf) (step 812), control passes to step 814 to determine if the timer is greater than zero and, if not, the timer is set (in step 816) to, for example, for example, about 250 ms to about 1,000 ms and control returns to step 806 to process the next raw sensor reading. If the timer is greater than zero, then it is decremented in step 818. In step 820, if the timer has expired, the current state is set to "feed present." Otherwise, the state remains set to "no feed" and control returns to step 806 to obtain the next reading.

If the current state is feed present (step 802), then control passes to step 830 in which a timer is initialized to zero. In step 832, the current reading is set based on the light intensity from the raw sensor reading. Control passes to step 834 in which a first filtered reading is generated based on the result of running the current reading through a first low pass filter using the first time constant. Next, at step 836, a third filtered reading is generated based on the result of running the current reading through a third low pass filter using the third time constant. If the third filtered reading is not greater than the sum of the first filtered reading and the rising threshold (Tr) (step 838), then control returns to step 830 to reset the timer. However, if the third filtered reading is greater than the sum of the first filtered reading and the rising threshold (Tr) (step 838), control passes to step 840 to determine if the timer is greater than zero and, if not, the timer is set to, for example, for example, about 1 second to about 4 seconds and control returns to step 832 to process the next raw sensor reading. If the timer is greater than zero, then it is decremented in step 844. In step 846, if the timer has expired, the current state is set to "no feed." Otherwise, the state remains set to "feed present" and control returns to step 832 to obtain the next reading.

With this embodiment, the rising threshold may be set to about 20% of the full scale and the falling threshold may be set to about 30% of the full scale. One variation on the embodiment described in connection with FIG. 8 is to set the fast-responding filter to have a zero time constant (i.e., to set the second time constant to zero). In this variation, the second filtered reading is substituted with the current reading and the low pass filter that uses the second time constant is not used.

Figure 9:
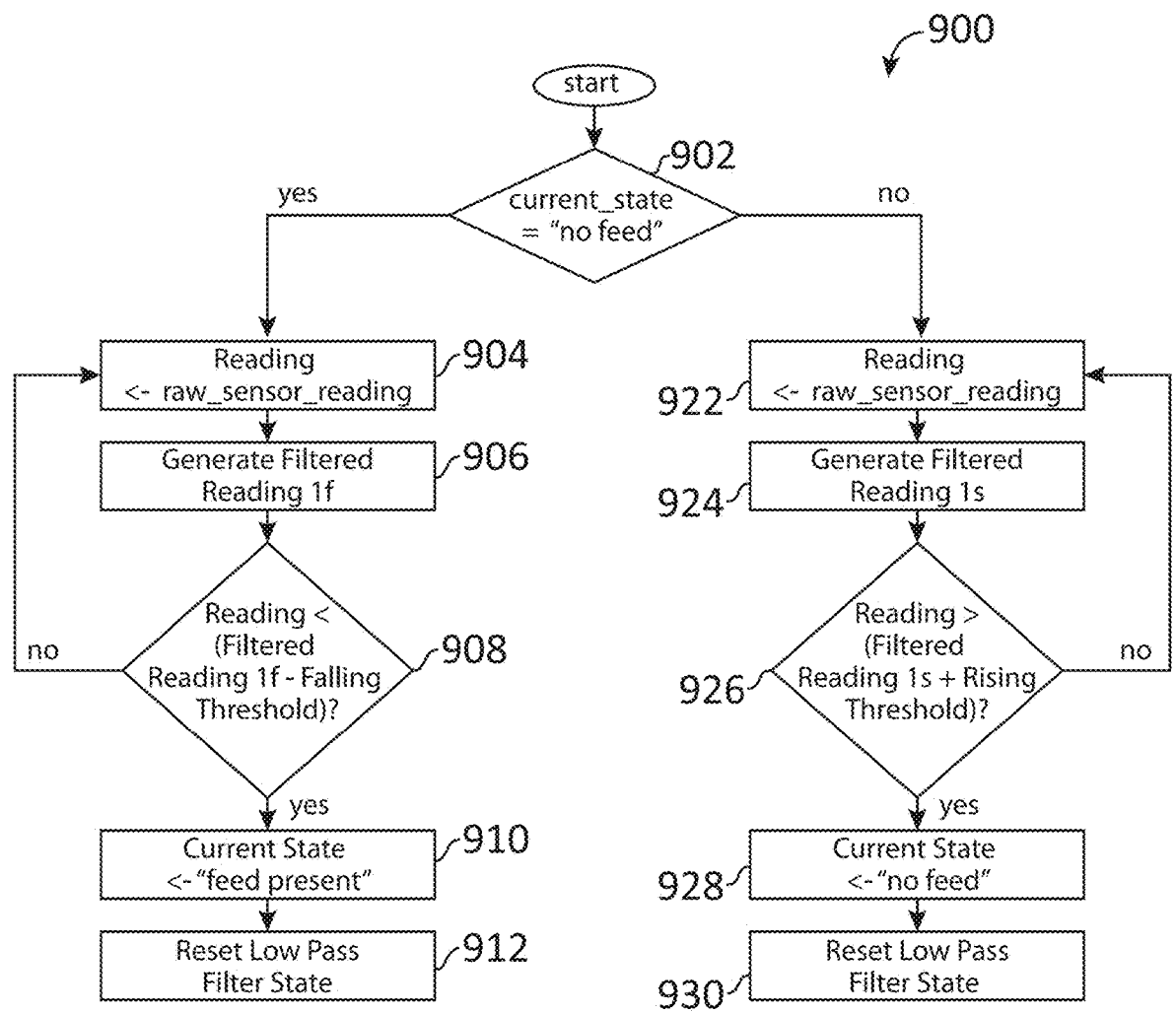
FIG. 9 is a flow chart describing an alternative algorithm used to process signals from a proximity detector that may be used with a granular material distribution system.

Yet another embodiment is to split the slow-responding filter (with the first time constant) into two separate filters, one having a faster time constant than the second. These can be designated the slow time constant (set to about 2 hours) and the fast time constant (set to about 16 seconds). In this embodiment, the second and third filtered readings are unnecessary. This embodiment is depicted in FIG. 9, with the method beginning at step 902. If the current state is no feed, then control passes to step 904 in which the current reading is set based on the light intensity from the raw sensor reading. Control passes to step 906 in which a fast filtered reading is generated based on the result of running the current reading through a low pass filter using the fast time constant. If the current reading is less than the difference between the fast filtered reading and the falling threshold (Tf) (step 908), control passes to step 910 in which the current state is set to "feed present" and the low pass filter state is reset (step 912). Otherwise, the state remains set to "no feed" and control returns to step 904 to obtain the next reading. Resetting the low pass filter state is accomplished in different ways depending on the type of filter used. For example, if using a rolling average (a ring buffer), the existing values in the buffer are discarded and the filter starts over re-filling the buffer.

If the current state is feed present (step 902), then control passes to step 922 in which the current reading is set based on the light intensity from the raw sensor reading. Control passes to step 924 in which a slow filtered reading is generated based on the result of running the current reading through a second low pass filter using the slow time constant. If the current reading is greater than the sum of the slow filtered reading and the rising threshold (Tr) (step 926), control passes to step 928 in which the current state is set to "no feed" and the low pass filter state is reset (step 930). Otherwise, the state remains set to "feed present" and control returns to step 922 to obtain the next reading.

As before, a number of possible filter implementations may be used, including averaging a ring buffer of recent readings, FIR (finite impulse response) filters, and/or IIR (infinite impulse response) filters.

Figure 10:
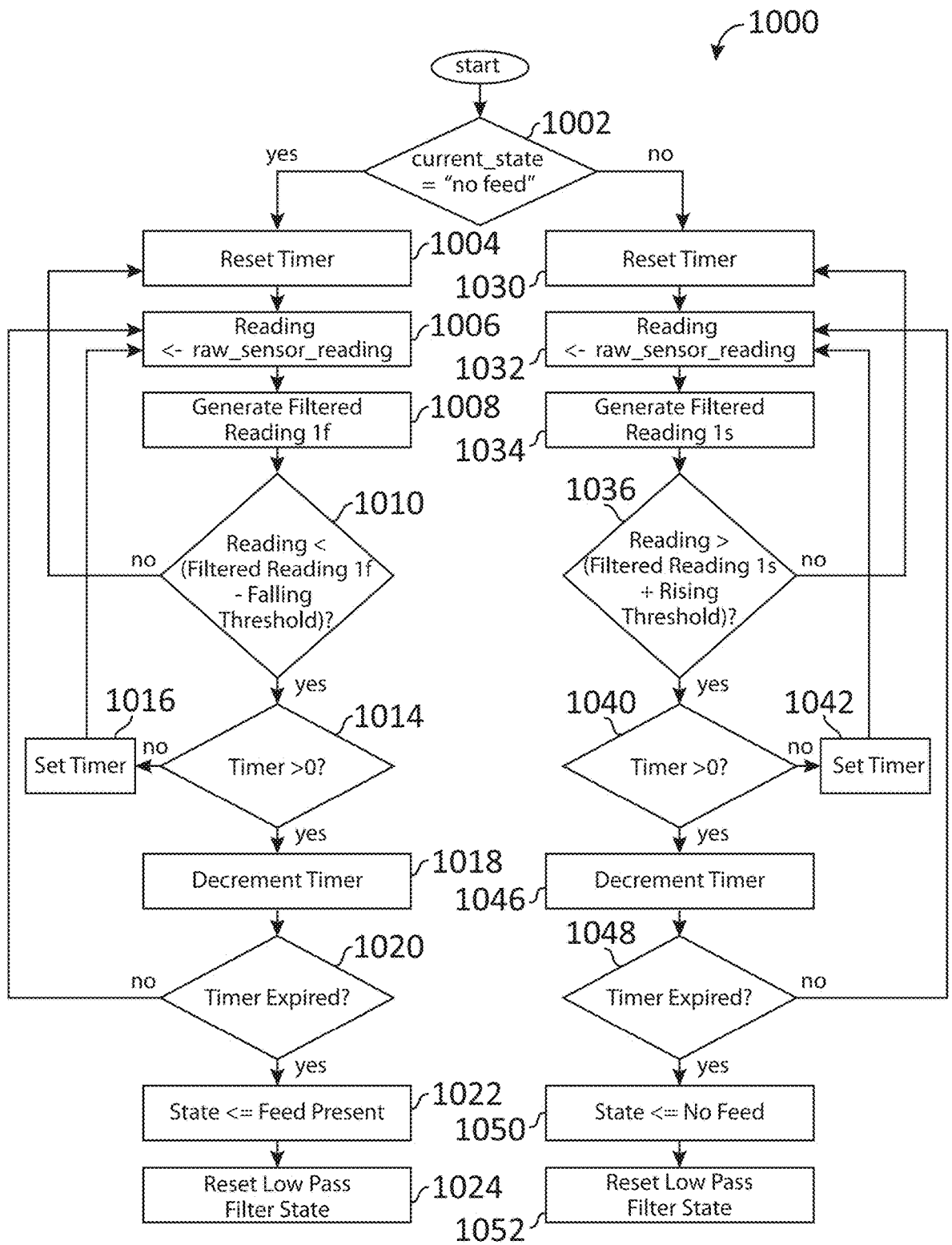
FIG. 10 is a flow chart describing an alternative algorithm used to process signals from a proximity detector that may be used with a granular material distribution system.

The method described in FIG. 9 may be expanded in a manner similar to the method of FIG. 8. As illustrated in FIG. 10, the method begins at step 1002. If the current state is no feed, then control passes to step 1004 to initialize a timer to zero and then on to step 1006 in which the current reading is set based on the light intensity from the raw sensor reading. Control passes to step 1008 in which a fast filtered reading is generated based on the result of running the current reading through a low pass filter using a fast time constant. If the current reading is not less than the difference between the fast filtered reading and the falling threshold (Tf) (step 1010), then control returns to step 1004 to reset the timer. However, if the current reading is less than the difference between the fast filtered reading and the falling threshold (Tf) (step 1010), control passes to step 1014 to determine if the timer is greater than zero and, if not, the timer is set (in step 1016) to, for example, between 250 and 1000 msec, and control returns to step 1006 to process the next raw sensor reading. If the timer is greater than zero, then it is decremented in step 1018. In step 1020, if the timer has expired, the current state is set to "feed present" (step 1022) and the low pass filter state is reset (step 1024). Otherwise, the state remains set to "no feed" and control returns to step 1006 to obtain the next reading.

If the current state is feed present (step 1002), then control passes to step to step 1030 to initialize a timer to zero and then on to 1032 in which the current reading is set based on the light intensity from the raw sensor reading. Control passes to step 1034 in which a slow filtered reading is generated based on the result of running the current reading through a low pass filter using a slow time constant. If the current reading is not greater than the sum of the slow filtered reading and the rising threshold (Tr) (step 1036), then control returns to step 1030 to reset the timer. However, if the current reading is greater than the sum of the slow filtered reading and the rising threshold (Tr) (step 1036), control passes to step 1040 to determine if the timer is greater than zero and, if not, the timer is set (in step 1042) to, for example, between about 250 and 1000 msec, and control returns to step 1032 to process the next raw sensor reading. If the timer is greater than zero, then it is decremented in step 1046. In step 1048, if the timer has expired, the current state is set to "no feed" (step 1050) and the low pass filter state is reset (step 1052). Otherwise, the state remains set to "feed present" and control returns to step 1032 to obtain the next reading.

Figure 6:
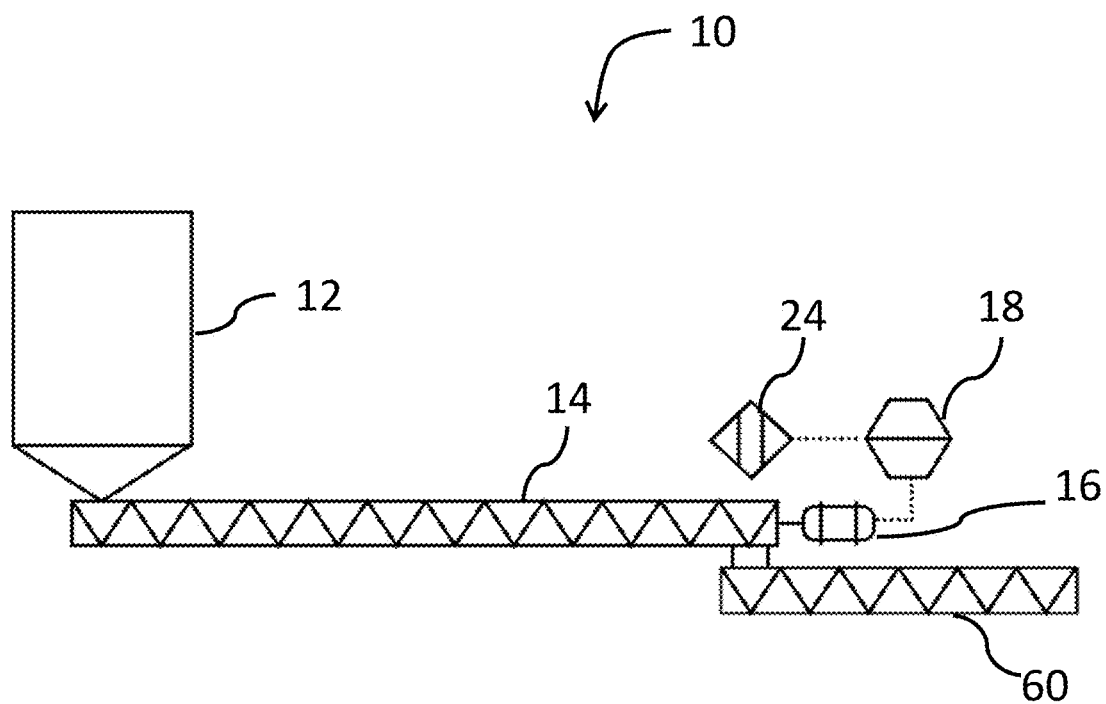
FIG. 6 is a block diagram illustrating the principal components of another embodiment of a granular material distribution system.

FIG. 6 illustrates an alternative system that includes two conveyors. The first conveyor 14 feeds a second conveyor 60 (which might not support the same feed movement rate as conveyor 14). In this embodiment, the proximity detector 24 is positioned above or adjacent the distal end of the first conveyor 14. In the event the second conveyor 60 is either stopped or running slower than the first conveyor, feed will quickly build up at the end of the first conveyor 14. The proximity detector 24 preferably detects this buildup of feed.

If, in this configuration, the system does not see regular transitions between feed present and feed not present, the method described above whereby the thresholds are automatically adjusted may not adjust properly. An alternative embodiment, which is aimed at addressing slowly changing environmental conditions (such as humidity) or slowly changing circuit parameters (such as light source intensity), relies on observing raw signal changes at two different time scales, the long time scale associated with environmental conditions changing and the short time scale associated with feed backing up at the end of the first conveyor.

Using any of the algorithms described above, the rising and falling thresholds may be set relative to a baseline value. For example, the current intensity reading may be compared to the falling threshold plus a baseline value, where the baseline value is initialized to zero. Similarly, all reading comparisons to the rising or falling thresholds are equivalently transformed.

While in the "feed present" state, the baseline is continually updated with a low-pass filtering average computation, such as (baseline=←α*current reading+(1−α)*baseline), where α is chosen to reflect the long time scales associated with environmental change.

While in the "no feed" state, we must compensate for the fact that the baseline value is at the other end of the range of raw sensor readings. To accomplish this, we maintain an average reading in the "no feed" state that is similar in style to the baseline value, such as no_feed_avg=α*current reading+(1−α)*no_feed_avg. The baseline may then be adjusted by exploiting the most recently measured span, which is span=maximum intensity reading less the minimum intensity reading. The expression for baseline is therefore baseline=no_feed_avg−span. This enables the effective thresholds (actual values to which raw readings are compared) to adjust over time, even without a state transition.

Although certain illustrative embodiments and methods have been disclosed herein, it will be apparent from the foregoing disclosure to those skilled in the art that variations and modifications of such embodiments and methods may be made without departing from the spirit and scope of the invention. For example, although many of the embodiments described herein have been described using a proximity detector incorporating optical sensors, it will be understood that the embodiments are equally effective using other forms of sensors such as capacitive sensors. In addition, although many of the embodiments illustrated herein are feed distribution systems, the systems and methods described herein may be used in connection with proximity detectors used to sense any granular material. Accordingly, it is intended that the invention should be limited only to extent required by the appended claims and the rules and principals of applicable law.

The invention claimed is:

1. A proximity detector comprising a sensor providing a proximity reading, the proximity detector having a rising threshold level and a falling threshold level, wherein the falling threshold level is less than the rising threshold level, wherein the proximity detector comprises a state selected from the group of no material present and material present and is initially set to no material present, and wherein the proximity detector:

filters the proximity reading through a first low pass filter using a first time constant to generate a first filtered reading;

filters the proximity reading through a second low pass filter using a second time constant to generate a second filtered reading;

filters the proximity reading through a third low pass filter using a third time constant to generate a third filtered reading;

while in the no material present state, enters the material present state when the second filtered reading is less than the difference between the first filtered reading and the falling threshold; and while in the material present state, enters the no material present state when the third filtered reading is greater than the sum of the first filtered reading and the rising threshold.

2. The proximity detector of claim 1 wherein the first time constant is greater than the third time constant and the second time constant is less than the first time constant and greater than the third time constant.

3. The proximity detector of claim 1 wherein the proximity detector comprises an optical sensor providing a light intensity reading.

4. The proximity detector of claim 1 wherein the low pass filters comprise finite impulse response filters.

5. The proximity detector of claim 1 wherein the low pass filters comprise infinite impulse response filters.

6. The proximity detector of claim 1 wherein the proximity detector will enter the material present state only when the second filtered reading remains less than the difference between the first filtered reading and the falling threshold for a predetermined period of time.

7. The proximity detector of claim 1 wherein the proximity detector will enter the no material present state only when the third filtered reading remains greater than the sum of the first filtered reading and the rising threshold for a predetermined period of time.

8. A proximity detector comprising a sensor providing a proximity reading, the proximity detector having a rising threshold level and a falling threshold level, wherein the falling threshold level is less than the rising threshold level, wherein the proximity detector comprises a state selected from the group of no material present and material present and is initially set to no material present, and wherein the proximity detector:

filters the proximity reading through a low pass filter using a fast time constant to generate a fast filtered reading;

filters the proximity reading through a low pass filter using a slow time constant to generate a slow filtered reading;

while in the no material present state, enters the material present state when the proximity reading is less than the difference between the fast filtered reading and the falling threshold; and while in the material present state, enters the no material present state when the proximity reading is greater than the sum of the slow filtered reading and the rising threshold.

9. The proximity detector of claim 8 wherein the proximity detector will enter the material present state only when the second filtered reading remains less than the difference between the first filtered reading and the falling threshold for a predetermined period of time.

10. The proximity detector of claim 8 wherein the proximity detector will enter the no material present state only when the third filtered reading remains greater than the sum of the first filtered reading and the rising threshold for a predetermined period of time.

* * * * *